United States Patent
Kwon et al.

(10) Patent No.: US 11,856,701 B2
(45) Date of Patent: Dec. 26, 2023

(54) PRINTED CIRCUIT BOARD

(71) Applicant: SAMSUNG ELECTRO-MECHANICS CO., LTD., Suwon-si (KR)

(72) Inventors: Hyun Woo Kwon, Suwon-si (KR); Ki Ran Park, Suwon-si (KR); Kyeong Yub Jung, Suwon-si (KR); Jin Uk Lee, Suwon-si (KR); Jae Heun Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 16 days.

(21) Appl. No.: 17/673,405

(22) Filed: Feb. 16, 2022

(65) Prior Publication Data

US 2023/0156922 A1    May 18, 2023

(30) Foreign Application Priority Data

Nov. 17, 2021    (KR) ........................ 10-2021-0158568

(51) Int. Cl.
*H05K 1/18*    (2006.01)
*H05K 3/46*    (2006.01)
*H05K 1/11*    (2006.01)

(52) U.S. Cl.
CPC ............. *H05K 1/185* (2013.01); *H05K 1/112* (2013.01); *H05K 1/183* (2013.01); *H05K 3/4697* (2013.01)

(58) Field of Classification Search
CPC ........ H05K 1/185; H05K 1/122; H05K 1/183; H05K 3/4697
USPC ........................................................ 361/761
See application file for complete search history.

(56) References Cited

U.S. PATENT DOCUMENTS

| | | | |
|---|---|---|---|
| 2015/0334843 A1 | 11/2015 | Jung et al. | |
| 2017/0186528 A1* | 6/2017 | Otsubo | H01F 41/041 |
| 2020/0245465 A1* | 7/2020 | Zhang | H05K 1/183 |
| 2021/0022250 A1* | 1/2021 | Jung | H05K 3/4697 |

FOREIGN PATENT DOCUMENTS

| | | |
|---|---|---|
| JP | 2008-288298 A | 11/2008 |
| KR | 10-2014-0083314 A | 7/2014 |

* cited by examiner

*Primary Examiner* — Andargie M Aychillhum
(74) *Attorney, Agent, or Firm* — MORGAN, LEWIS & BOCKIUS LLP

(57) ABSTRACT

A printed circuit board includes: a first insulating layer including a first cavity and a second cavity; a first electronic component disposed in the first cavity and including a first pad disposed in a first surface direction of the first insulating layer; a second electronic component disposed in the second cavity and including a second pad disposed in a second surface direction, facing the first surface direction, of the first insulating layer; a second insulating layer disposed on each of first and second surfaces of the first insulating layer and in the first cavity to cover the first electronic component; and a third insulating layer disposed on the first surface of the first insulating layer and in the second cavity to cover the second electronic component.

17 Claims, 12 Drawing Sheets

PRINTED CIRCUIT BOARD

CROSS-REFERENCE TO RELATED APPLICATION(S)

This application claims benefit of priority to Korean Patent Application No. 10-2021-0158568 filed on Nov. 17, 2021 in the Korean Intellectual Property Office, the disclosure of which is incorporated herein by reference in its entirety.

TECHNICAL FIELD

The present disclosure relates to a printed circuit board and a method for manufacturing the same.

BACKGROUND

In order to follow the recent trend of mobile devices towards weight and size reductions, there has also been a growing need for making printed circuit boards to be mounted thereon lighter, thinner, shorter, and smaller.

Meanwhile, to meet technical requirements according to the mobile devices that have become lighter, thinner, shorter, and smaller, there has been a need for a technology for inserting electronic components such as ICs, active devices, or passive devices into a board to shorten a connection path between the electronic components and improve noise. Accordingly, research into technology for embedding a component in a board has recently been continued in various ways.

In particular, a board is formed to have a cavity therein to insert various components into the board, and a technique using a blasting process or the like is performed to form a cavity.

SUMMARY

An aspect of the present disclosure may provide a printed circuit board including a microcircuit and/or a micro via.

Another aspect of the present disclosure may provide a printed circuit board in which an electronic component is mounted in a cavity.

Another aspect of the present disclosure may provide a printed circuit board for securing an insulation distance between electronic components mounted in both directions.

According to an aspect of the present disclosure, a printed circuit board may include: a first insulating layer including a first cavity and a second cavity; a first electronic component disposed in the first cavity and including a first pad disposed in a first surface direction of the first insulating layer; a second electronic component disposed in the second cavity and including a second pad disposed in a second surface direction, facing the first surface direction, of the first insulating layer; a second insulating layer disposed on each of first and second surfaces of the first insulating layer and in the first cavity to cover the first electronic component; and a third insulating layer disposed on the first surface of the first insulating layer and in the second cavity to cover the second electronic component.

According to another aspect of the present disclosure, a method of manufacturing a printed circuit board includes forming a first cavity penetrating through a first insulating layer having first and second surfaces opposing each other; disposing a first tape on the first surface of the first insulating layer; disposing a first electronic component in the first cavity such that at least a portion of the first electronic component is in contact with the first tape; disposing a second insulating layer covering the first electronic component on the first tape; removing the first tape; forming a second cavity penetrating through at least a portion of each of the first and second insulating layers; disposing a second tape on the second surface of the first insulating layer; disposing a second electronic component in the second cavity to be in contact with the second tape; disposing a third insulating layer covering the second electronic component on a first surface of the second insulating layer; and removing the second tape.

According to another aspect of the present disclosure, a printed circuit board may include: a first insulating layer having first and second surfaces opposing each other, and including a first cavity penetrating through the first and second surfaces; a first electronic component disposed in the first cavity and including a first pad; a second insulating layer disposed in the first cavity to cover the first electronic component, and extending on the first and second surfaces of the first insulating layer; a second electronic component including a second pad and disposed in a second cavity which penetrates through the first insulating layer and the second insulating layer; and a third insulating layer disposed in the second cavity to cover the second electronic component, and extending on the second insulating layer. The first pad and the second pad may be disposed in opposite directions.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Electronic Device

Figure 1:
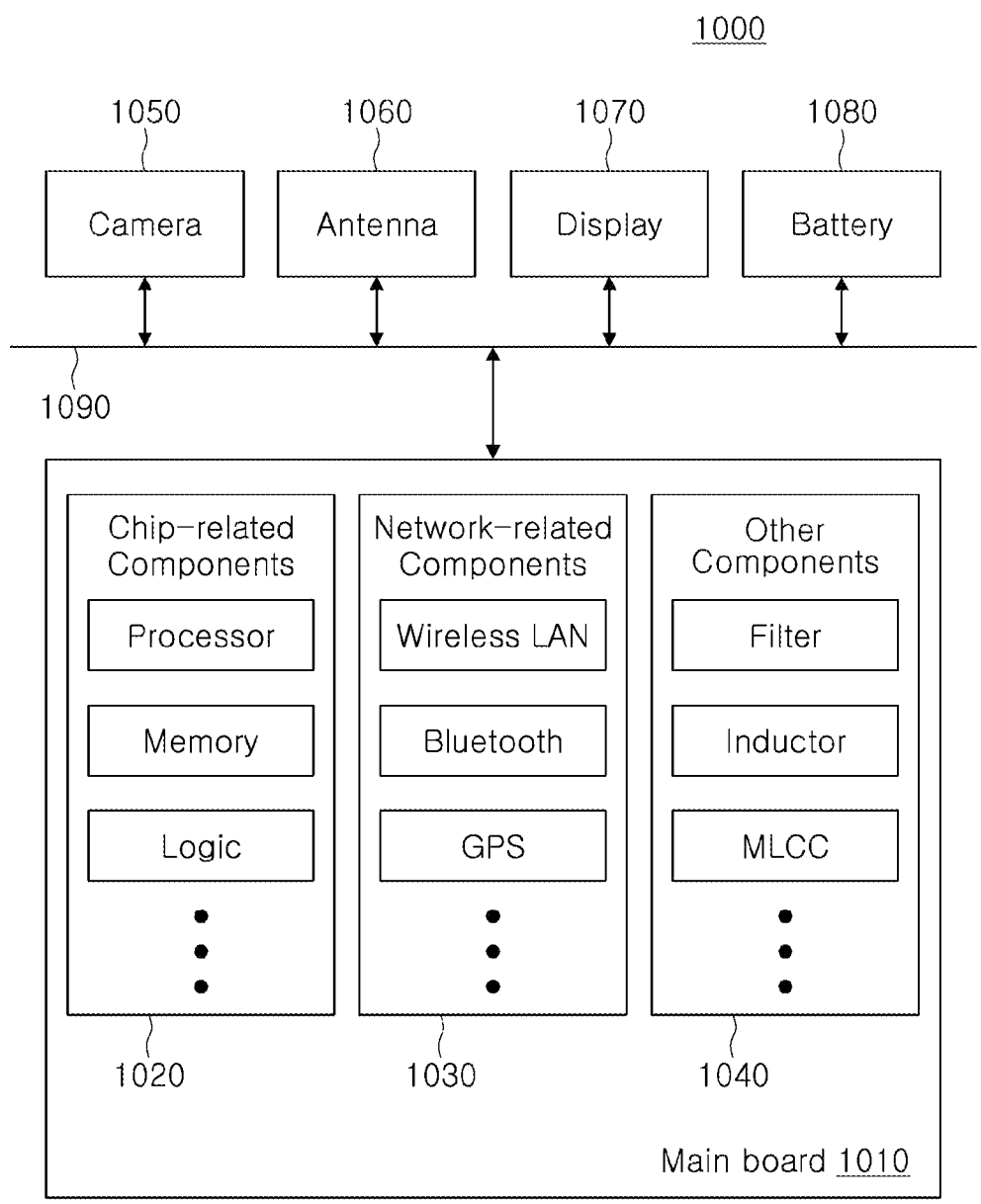
FIG. 1 is a diagram schematically illustrating an example of an electronic device system.

FIG. 1 is a block diagram schematically illustrating an example of an electronic device system.

Referring to FIG. 1, an electronic device 1000 may accommodate a mainboard 1010 therein. The mainboard 1010 may include chip-related components 1020, network-related components 1030, and other components 1040, which are physically or electrically connected thereto. These components may be connected to other electronic components to be described below to form various signal lines 1090.

The chip-related components 1020 may include a memory chip such as a volatile memory (e.g., a dynamic random access memory (DRAM)), a non-volatile memory (e.g., a read only memory (ROM)), or a flash memory; an application processor chip such as a central processor (e.g., a central processing unit (CPU)), a graphics processor (e.g., a graphics processing unit (GPU)), a digital signal processor, a cryptographic processor, a microprocessor, or a microcontroller; and a logic chip such as an analog-digital converter (ADC) or an application-specific integrated circuit (ASIC). The chip-related components 1020 are not limited thereto, but may also include other types of chip-related electronic components. In addition, these electronic components 1020 may be combined with each other. The chip-related components 1020 may be in the form of a package including the chips or electronic components described above.

The network-related components 1030 may include protocols such as wireless fidelity (Wi-Fi) (Institute of Electrical and Electronics Engineers (IEEE) 802.11 family or the like), worldwide interoperability for microwave access (WiMAX) (IEEE 802.16 family or the like), IEEE 802.20, long term evolution (LTE), evolution data only (Ev-DO), high speed packet access+ (HSPA+), high speed downlink packet access+ (HSDPA+), high speed uplink packet access+ (HSUPA+), global system for mobile communications (GSM), enhanced data GSM environment (EDGE), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with each other, together with the chip-related electronic components 1020.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, but also include passive elements in chip component type used for various other purposes, and the like. In addition, the other components 1040 may be combined with each other, together with the chip-related electronic components 1020 and/or the network-related electronic components 1030.

Depending on the type of electronic device 1000, the electronic device 1000 may include other electronic components that may or may not be physically and/or electrically connected to the mainboard 1010. Examples of the other electronic components may include a camera 1050, an antenna 1060, a display 1070, a battery 1080, and the like. The other electronic components are not limited thereto, but may be an audio codec, a video codec, a power amplifier, a compass, an accelerometer, a gyroscope, a speaker, a mass storage unit (e.g., a hard disk drive), a compact disk (CD), a digital versatile disk (DVD), and the like. The other electronic components may also include other electronic components and the like used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
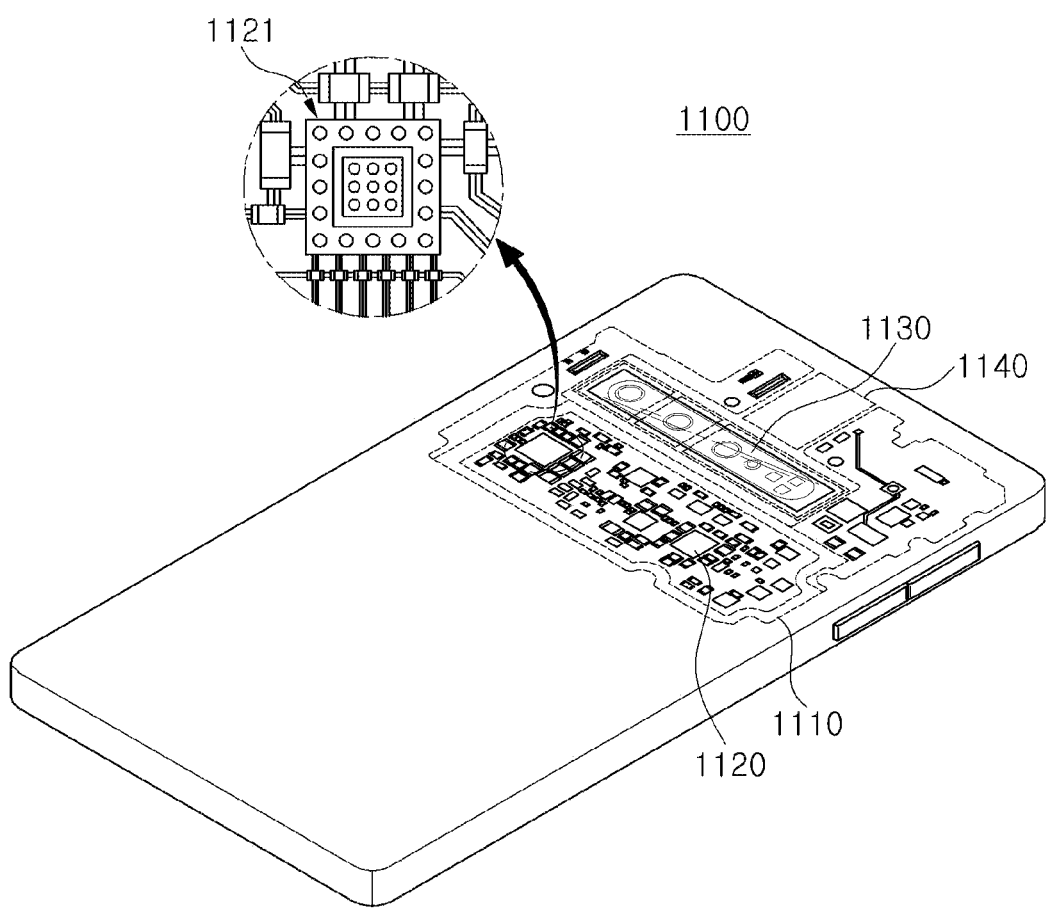
FIG. 2 is a diagram schematically illustrating an example of an electronic device.

FIG. 2 is a perspective view schematically illustrating an example of an electronic device.

Referring to FIG. 2, the electronic device may be, for example, a smartphone 1100. A mainboard 1110 may be accommodated in the smartphone 1100, and various electronic components 1120 may be physically and/or electrically connected to the mainboard 1110. In addition, other electronic components that may or may not be physically and/or electrically connected to the mainboard 1110, such as a camera module 1130 and/or a speaker 1140, may also be accommodated therein. Some of the electronic components 1120 may be the above-described chip-related components, e.g., an antenna module 1121, but are not limited thereto. The antenna module 1121 may be in such a form that the electronic component is surface-mounted on a printed circuit board, but is not limited thereto. Meanwhile, the electronic device is not necessarily limited to the smartphone 1100, but may be any other electronic device as described above.

Printed Circuit Board

Figure 3:
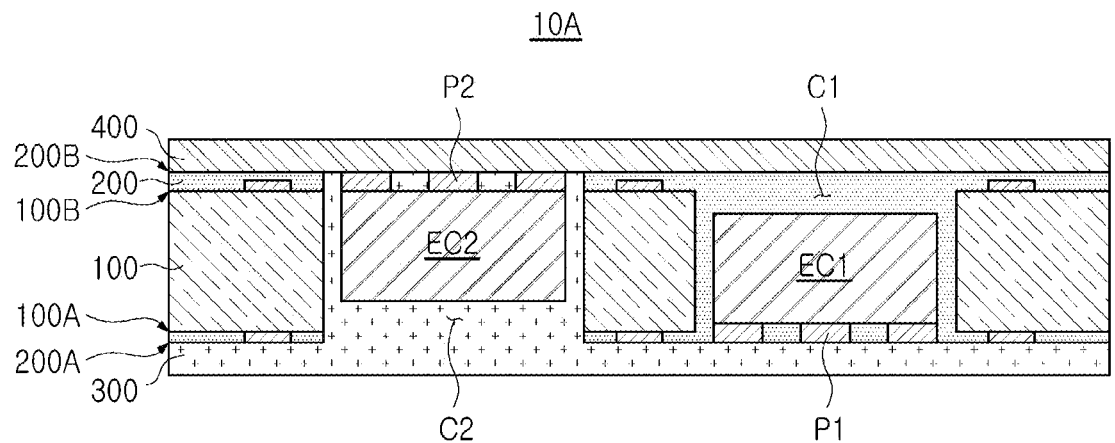
FIG. 3 is a diagram schematically illustrating an example of a printed circuit board according to the present disclosure.

FIG. 3 is a diagram schematically illustrating an example of a printed circuit board 10A according to the present disclosure.

Referring to FIG. 3, the printed circuit board 10A according to the present disclosure may include: a first insulating layer 100 including a first cavity and a second cavity C1 and C2; a first electronic component EC1 mounted in the first cavity C1 and including a first pad P1 disposed in a first direction; a second electronic component EC2 mounted in the second cavity C2 and including a second pad P2 disposed in a second direction opposite to the first direction in a thickness direction; a second insulating layer 200 disposed on each of first and second surfaces 100A and 100B opposing each other of the first insulating layer 100 and in the first cavity C1 to cover the first electronic component EC1; and a third insulating layer 300 disposed on the first surface 100A of the first insulating layer 100 and in the second cavity C2 to cover the second electronic component EC2. In particular, at least a portion of the third insulating layer 300 may be in contact with a first surface 200A of the second insulating layer 200, but the third insulating layer 300 is not limited thereto.

In this case, the first direction may be a direction in which the first surface 100A, of the first and second surfaces 100A and 100B opposing each other, of the first insulating layer 100 is disposed, and the second direction may be a direction in which the second surface 100B of the first insulating layer 100 is disposed. Referring to FIG. 3, the first pad P1 of the first electronic component EC1 may be disposed in a lower surface direction of the first insulating layer 100, and the second pad P2 of the second electronic component EC2 may be disposed in an upper surface direction of the first insulating layer 100, but the first pad P1 and the second pad P2 is not limited thereto.

In this case, by preventing the first and second pads P1 and P2 of the first and second electronic components EC1 and EC2 from being spaced too far from or too close to the first to third insulating layers to be described below, an insulation distance between an electronic component and an insulating layer may be adjusted regardless of a direction in which the component is mounted, and a via and a circuit pattern may be stably formed, but the technical effect is not limited thereto.

In addition, the second and third insulating layers 200 and 300 of the printed circuit board 10A according to the present disclosure may include the same composition, but is not limited thereto. However, since the second insulating layer 200 and the third insulating layer 300 are stacked through different processes, an interface may be formed between the second and third insulating layers 200 and 300, and the second and third insulating layers 200 and 300 may not be integrally formed.

In addition, at least a portion of the third insulating layer 300 of the printed circuit board 10A according to the present disclosure may be in contact with the first pad P1 of the first electronic component EC1, but the third insulating layer 300 is not limited thereto. That is, the third insulating layer 300 may be in contact with the first pad P1 of the first electronic component while being disposed on the first surface 200A of the second insulating layer 200. In addition, a via penetrating through at least a portion of the third insulating layer 300 may be formed so that the first pad P1 of the first electronic component is electrically connected to a circuit pattern disposed on the third insulating layer 300 through the via, but is not limited thereto.

In addition, the printed circuit board 10A according to the present disclosure may further include a fourth insulating layer 400 disposed on a second surface 200B opposite to the first surface 200A in the thickness direction of the second insulating layer 200. In this case, at least a portion of the fourth insulating layer 400 may be in contact with the second pad P2 of the second electronic component EC2, but the fourth insulating layer 400 is not limited thereto. That is, the fourth insulating layer 400 may be in contact with the second pad P2 of the second electronic component while being disposed on the second surface 200B of the second insulating layer 200. In addition, a via penetrating through at least a portion of the fourth insulating layer 400 may be formed so that the second pad P2 of the second electronic component EC2 is electrically connected to a circuit pattern disposed on the fourth insulating layer 400 through the via, but is not limited thereto.

In addition, in the printed circuit board 10A according to the present disclosure, the first pad P1 of the first electronic component EC1 and the first surface 200A of the second insulating layer may be coplanar with each other. That is, the first pad P1 of the first electronic component EC1 may be disposed on the same plane as the first surface 200A of the second insulating layer 200, but is not limited thereto.

In addition, in the printed circuit board 10A according to the present disclosure, the second pad P2 of the second electronic component EC2 and the second surface 200B of the second insulating layer 200 may be coplanar with each other. That is, the second pad P2 of the second electronic component EC2 may be disposed on the same plane as the second surface 200B of the second insulating layer 200, but is not limited thereto.

The first to fourth insulating layers 100 to 400 of the printed circuit board 10A according to the present disclosure may include a known insulating material, but is not limited thereto. More specifically, an insulating material applicable for the first to fourth insulating layers 100 to 400 may be at least one of a thermosetting resin such as an epoxy resin, a thermoplastic resin such as a polyimide resin, and a resin in which the thermosetting or thermoplastic resin is impregnated together with an inorganic filler in a core material such as a glass fiber (glass cloth or glass fabric), for example, prepreg, Ajinomoto build-up film (ABF), FR-4, or bismaleimide triazine (BT).

In addition, a material applicable for each of the circuit layer or the via may be a conductive material such as copper (Cu), aluminum (Al), silver (Ag), tin (Sn), gold (Au), nickel (Ni), lead (Pb), titanium (Ti), palladium (Pd), or alloys thereof, but is not limited thereto. In this case, the via may be a via penetrating through at least a portion of each of the first to fourth insulating layers 100 to 400, and the circuit layer may be a circuit layer disposed on at least a portion of each of the first to fourth insulating layers 100 to 400.

In addition, each of the circuit layer and the via of the printed circuit board 10A according to the present disclosure may include an electroless plating layer and an electrolytic plating layer. The electroless plating layer may serve as a seed layer for the electrolytic plating layer, but is not limited thereto.

In this case, the electroless plating layer and the electrolytic plating layer filling each of the circuit layer and the via may also include copper (Cu), aluminum (Al), silver (Ag), tin (Sn), gold (Au), nickel (Ni), lead (Pb), titanium (Ti), palladium (Pd), or alloys thereof.

At least a portion of a circuit layer formed on one surface of an insulating layer disposed as an outermost layer of the printed circuit board 10A according to the present disclosure may include a surface treatment layer, and the surface treatment layer may include a different composition from each of the circuit layers. For example, each of the circuit layers may include copper (Cu), and the surface treatment layer may include nickel (Ni) or tin (Sn), but the circuit layer and the surface treatment layer are not limited thereto.

In addition, the printed circuit board 10A according to the present disclosure may further include a solder resist layer disposed to cover at least a portion of the circuit layer including the surface treatment layer formed as an outermost layer. In this case, the solder resist layer may be formed of a photosensitive material. In addition, the solder resist may have thermosetting and/or photo-curable properties, but is not limited thereto.

Figure 4:
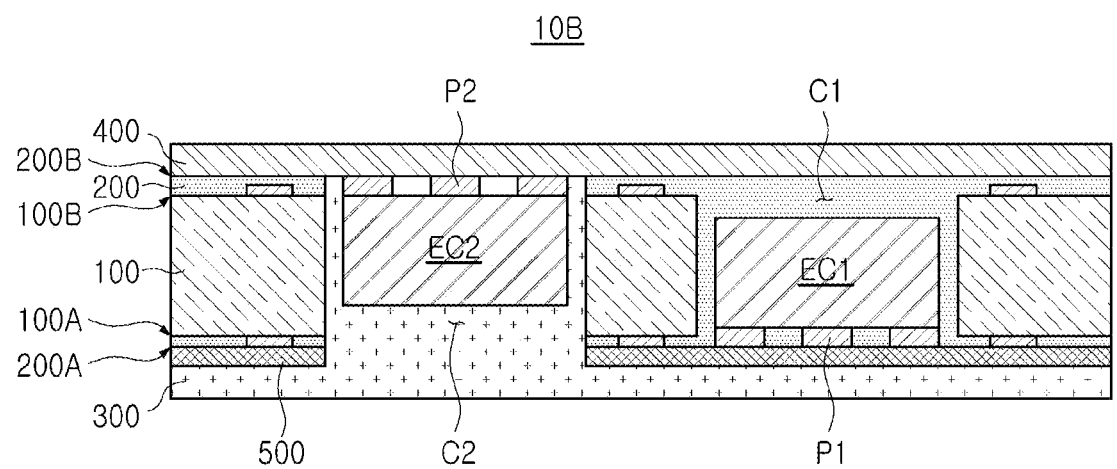
FIG. 4 is a diagram schematically illustrating an example of a printed circuit board according to the present disclosure.

FIG. 4 is a diagram schematically illustrating an example of a printed circuit board 10B according to the present disclosure.

Referring to FIG. 4, the printed circuit board 10B according to the present disclosure may include: a first insulating layer 100 including a first cavity and a second cavity C1 and C2; a first electronic component EC1 mounted in the first cavity C1 and including a first pad P1 disposed in a first surface 100A direction of the first insulating layer 100; a second electronic component EC2 mounted in the second cavity C2 and including a second pad P2 disposed in a second surface 100B direction opposite to the first surface 100A direction of the first insulating layer 100; a second insulating layer 200 disposed on each of first and second surfaces 100A and 100B opposing each other of the first insulating layer 100 and in the first cavity C1 to cover the first electronic component EC1; and a third insulating layer 300 disposed on the first surface 100A of the first insulating layer 100 and in the second cavity C2 to cover the second electronic component EC2.

In addition, the printed circuit board 10B according to the present disclosure may further include a fifth insulating layer 500 disposed on a first surface 200A of the second insulating layer 200 in contact with the third insulating layer 300. In this case, at least a portion of the fifth insulating layer 500 may be in contact with the first surface 200A of the second insulating layer 200, and the third insulating layer 300 may be disposed on one surface of the fifth insulating layer 500. That is, the fifth insulating layer 500 may be disposed between the first surface 200A of the second insulating layer 200 and the third insulating layer 300, but is not limited thereto.

That is, the fifth insulating layer 500 may be in contact with the first pad P1 of the first electronic component while being disposed on the first surface 200A of the second insulating layer 200. In addition, a via penetrating through at least a portion of each of the third and fifth insulating layers 300 and 500 may be formed so that the first pad P1 of the first electronic component EC1 is electrically connected to a circuit pattern disposed on the third insulating layer 300 through the via, but is not limited thereto.

The first to fifth insulating layers 100 to 500 of the printed circuit board 10B according to the present disclosure may include a known build-up insulating layer composition. More specifically, a build-up insulating layer composition applicable for the first to fifth insulating layers 100 to 500 may be at least one of a thermosetting resin such as an epoxy resin, a thermoplastic resin such as a polyimide resin, and a resin in which the thermosetting or thermoplastic resin is impregnated together with an inorganic filler in a core material such as a glass fiber (glass cloth or glass fabric), for example, prepreg, Ajinomoto build-up film (ABF), FR-4, or bismaleimide triazine (BT).

Concerning the other components, what has been described above is substantially identically applicable, and thus, the description thereof will not be repeated.

Method of Manufacturing Printed Circuit Board

FIGS. 5A to 5H are diagrams schematically illustrating a method of manufacturing an example of a printed circuit board 10A according to the present disclosure.

Referring to FIGS. 5A to 5H, the method of manufacturing the printed circuit board 10A according to the present disclosure is as follows.

Figure 5A:
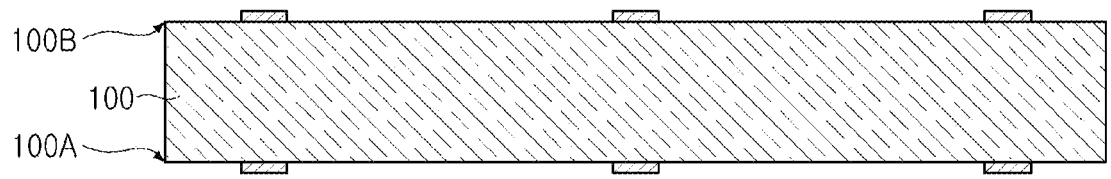
FIGS. 5A to 5H are diagrams schematically illustrating a method of manufacturing an example of a printed circuit board according to the present disclosure.

First, as illustrated in FIG. 5A, a first insulating layer 100 with at least one circuit layer formed on opposite surfaces thereof may be prepared. In this case, the first insulating layer 100 may be a core substrate or a central insulating layer, but is not limited thereto.

Figure 5B:
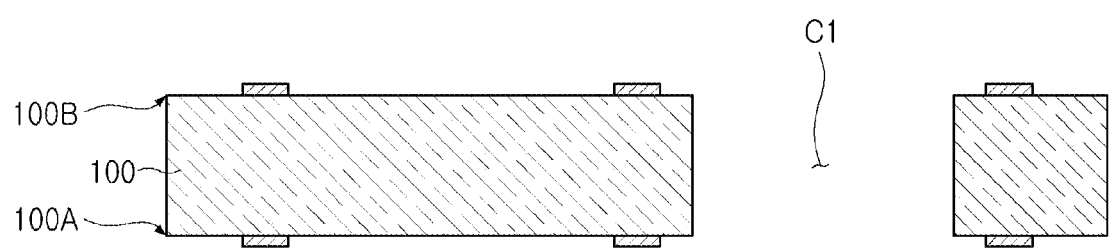

Thereafter, as illustrated in FIG. 5B, a first cavity C1 penetrating through at least a portion of the first insulating layer 100 may be formed. In this case, the first cavity C1 may be formed to penetrate through an entire depth of the first insulating layer 100 in a thickness direction, but is not limited thereto. In addition, the first cavity C1 may be formed to have a cross-sectional area or a diameter corresponding to a size of a first electronic component EC1 to be described below, but is not limited thereto.

Figure 5C:
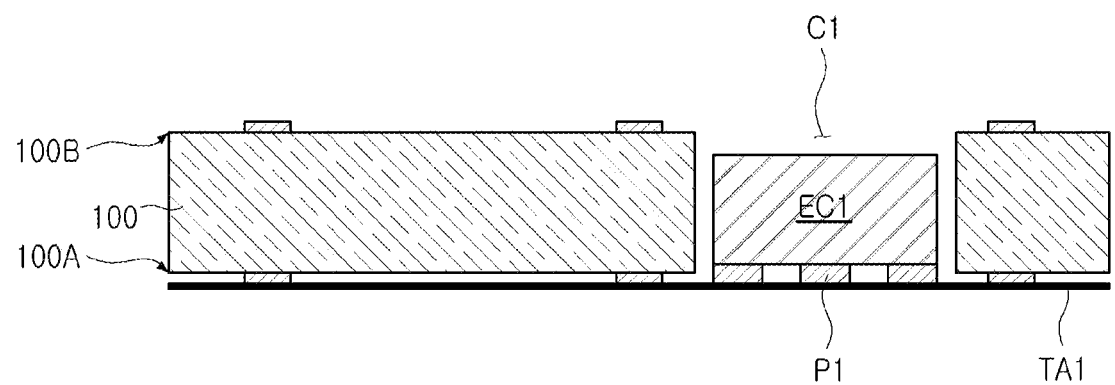

Thereafter, as illustrated in FIG. 5C, a first tape TA1 may be disposed to be entirely in contact with a first surface 100A of the first insulating layer 100. In this case, the first tape TA1 may extend to a bottom surface or one surface of the first cavity C1.

Thereafter, the first electronic component EC1 may be disposed inside the first cavity C1 formed in the first insulating layer 100 such that at least a portion thereof is in contact with the first tape TA1. In this case, the first electronic component EC1 may include a first pad P1, and the first pad P1 of the first electronic component EC1 may be disposed to be in contact with the first tape TA1.

Figure 5D:
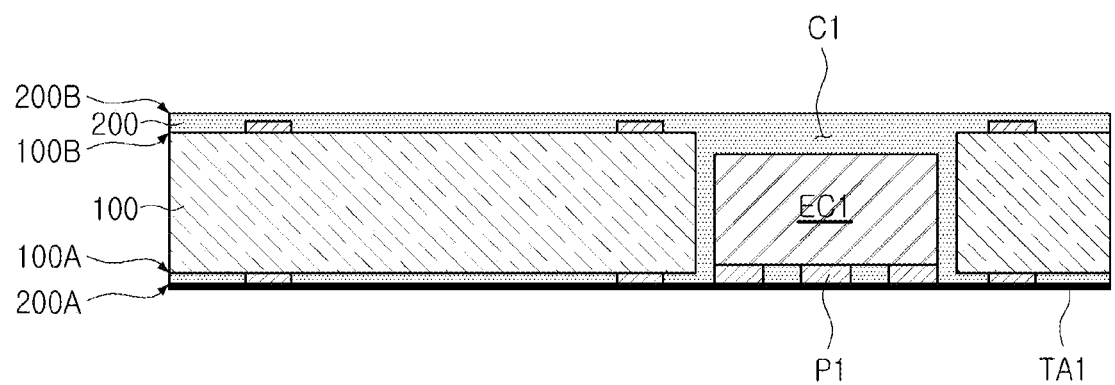

Thereafter, as illustrated in FIG. 5D, a second insulating layer 200 covering the first electronic component EC1 may be disposed on the first tape TA1. In this case, the second insulating layer 200 may extend to the first and second surfaces 100A and 100B facing each other of the first insulating layer 100. As a result, the first pad P1 of the first electronic component EC1 and a first surface 200A of the second insulating layer 200 may be coplanar with each other. That is, the first pad P1 of the first electronic component EC1 may be disposed on the same plane as the first surface 200A of the second insulating layer 200, but is not limited thereto.

Figure 5E:
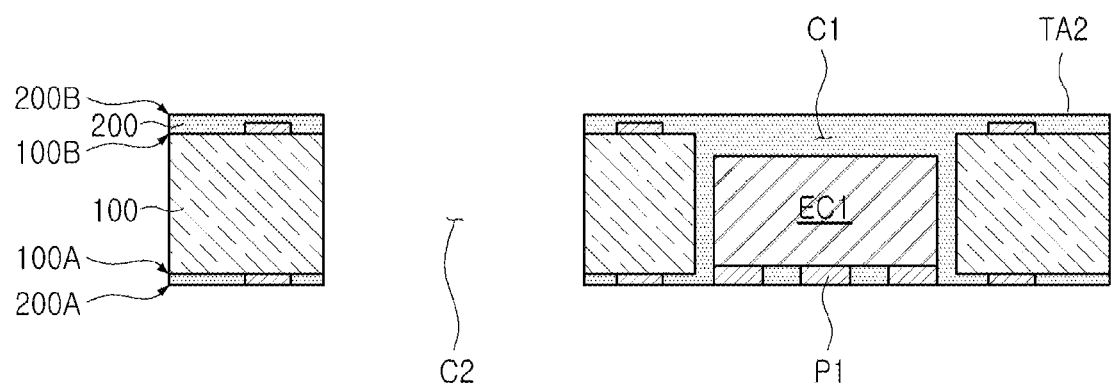

After disposing the first electronic component EC1 and the second insulating layer 200, the first tape TA1 may be removed. Thereafter, as illustrated in FIG. 5E, a second cavity C2 penetrating through at least a portion of each of the first and second insulating layers 100 and 200 may be formed. In this case, the second cavity C2 may be formed to entirely penetrate through the first and second insulating layers 100 and 200 in the thickness direction, but is not limited thereto. In addition, the second cavity C2 may be formed to have a cross-sectional area or a diameter corresponding to a size of a second electronic component EC2 to be described below, but is not limited thereto.

Figure 5F:
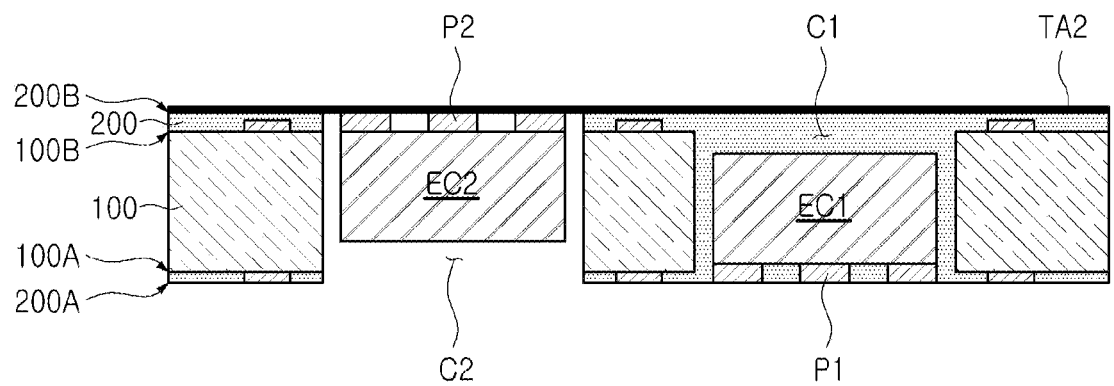

Thereafter, as illustrated in FIG. 5F, a second tape TA2 may be disposed to be entirely in contact with a second surface 200B of the second insulating layer 200. In this case, the second tape TA2 may extend to a bottom surface or one surface of the second cavity C2.

Thereafter, the second electronic component EC2 may be disposed inside the second cavity C2 penetrating through the first and second insulating layers 100 and 200 such that at least a portion thereof is in contact with the second tape TA2. In this case, the second electronic component EC2 may include a second pad P2, and the second pad P2 of the second electronic component EC2 may be disposed to be in contact with the second tape TA2.

As a result, the second pad P2 of the second electronic component EC2 and the second surface 200B of the second insulating layer may be coplanar with each other. That is, the second pad P2 of the second electronic component EC2 may be disposed on the same plane as the second surface 200B of the second insulating layer, but is not limited thereto.

Figure 5G:
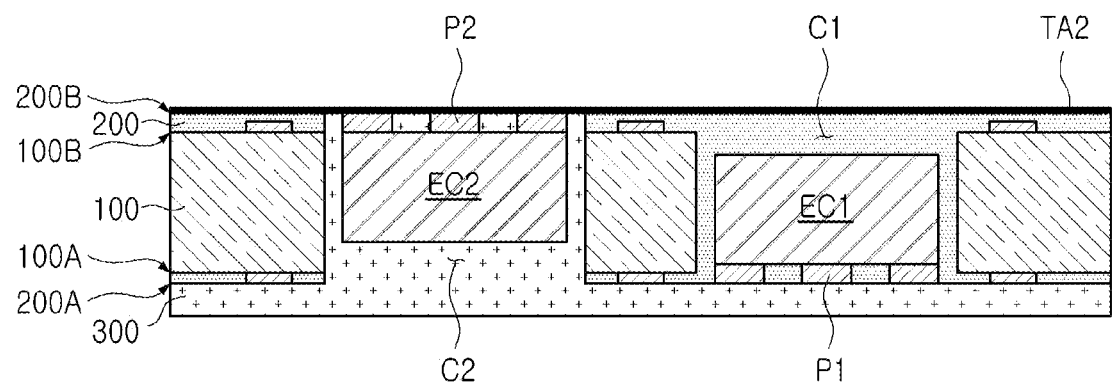

Thereafter, as illustrated in FIG. 5G, a third insulating layer 300 covering the second electronic component EC2 may be disposed on the second tape TA2. In this case, the third insulating layer 300 may extend to the second surface 200B of the second insulating layer 200. In addition, at least a portion of the third insulating layer 300 may be in contact with the first pad P1 of the first electronic component EC1, but is not limited thereto. In addition, a via penetrating through at least a portion of the third insulating layer 300 may be formed so that the first pad P1 of the first electronic component is electrically connected to a circuit pattern disposed on the third insulating layer 300 through the via, but is not limited thereto.

Figure 5H:
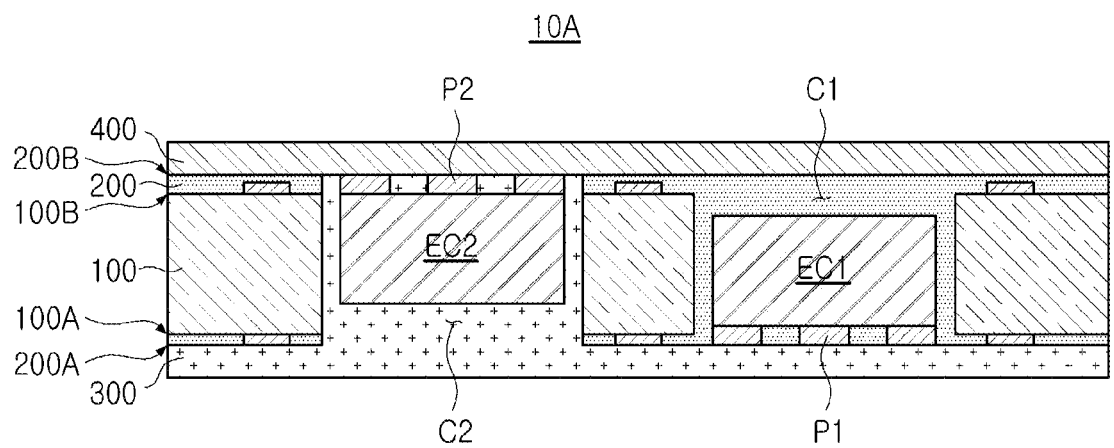

After disposing the second electronic component EC2 and the third insulating layer 300, the second tape TA2 may be removed. Thereafter, as illustrated in FIG. 5H, a fourth insulating layer 400 may be disposed on the second surface 200B opposing the first surface 200A of the second insulating layer 200, from which the second tape TA2 is removed, such that at least a portion thereof is in contact with the second pad P2 of the second electronic component EC2. In this case, the fourth insulating layer 400 may be in contact with the second pad P2 of the second electronic component EC2 while being disposed on the second surface 200B of the second insulating layer 200. In addition, a via penetrating through at least a portion of the fourth insulating layer 400 may be formed so that the second pad P2 of the second electronic component is electrically connected to a circuit pattern disposed on the fourth insulating layer 400 through the via, but is not limited thereto.

Concerning the other components, what has been described above is substantially identically applicable, and thus, the description thereof will not be repeated.

FIGS. 6A to 6I are diagrams schematically illustrating a method of manufacturing an example of a printed circuit board 10B according to the present disclosure.

Referring to FIGS. 6A to 6I, the method of manufacturing the printed circuit board 10B according to the present disclosure is as follows.

Figure 6A:
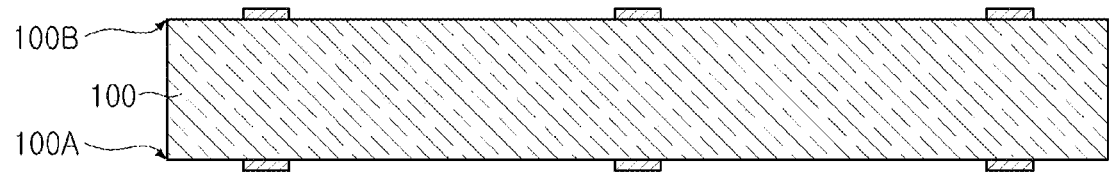
FIGS. 6A to 6I are diagrams schematically illustrating a method of manufacturing an example of a printed circuit board according to the present disclosure.

First, as illustrated in FIG. 6A, a first insulating layer 100 with at least one circuit layer formed on opposite surfaces thereof may be prepared. In this case, the first insulating layer 100 may be a core substrate or a central insulating layer, but is not limited thereto.

Figure 6B:
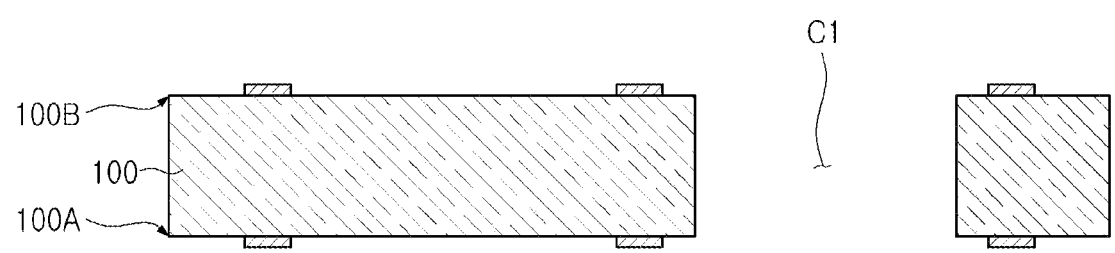

Thereafter, as illustrated in FIG. 6B, a first cavity C1 penetrating through at least a portion of the first insulating layer 100 may be formed. In this case, the first cavity C1 may be formed to penetrate through an entire depth of the first insulating layer 100 in a thickness direction, but is not limited thereto. In addition, the first cavity C1 may be formed to have a cross-sectional area or a diameter corresponding to a size of a first electronic component EC1 to be described below, but is not limited thereto.

Figure 6C:
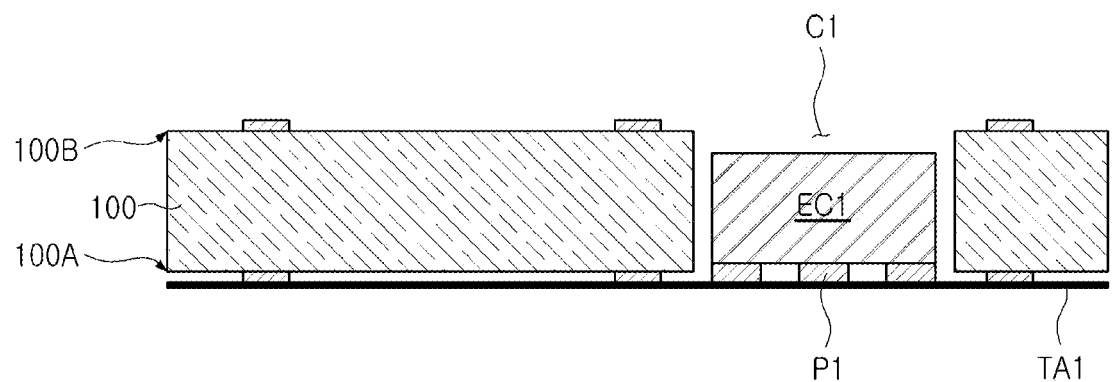

Thereafter, as illustrated in FIG. 6C, a first tape TA1 may be disposed to be entirely in contact with a first surface 100A of the first insulating layer 100. In this case, the first tape TA1 may extend to a bottom surface or one surface of the first cavity C1.

Thereafter, the first electronic component EC1 may be disposed inside the first cavity C1 formed in the first insulating layer 100 such that at least a portion thereof is in contact with the first tape TA1. In this case, the first electronic component EC1 may include a first pad P1, and the first pad P1 of the first electronic component EC1 may be disposed to be in contact with the first tape TA1.

Figure 6D:
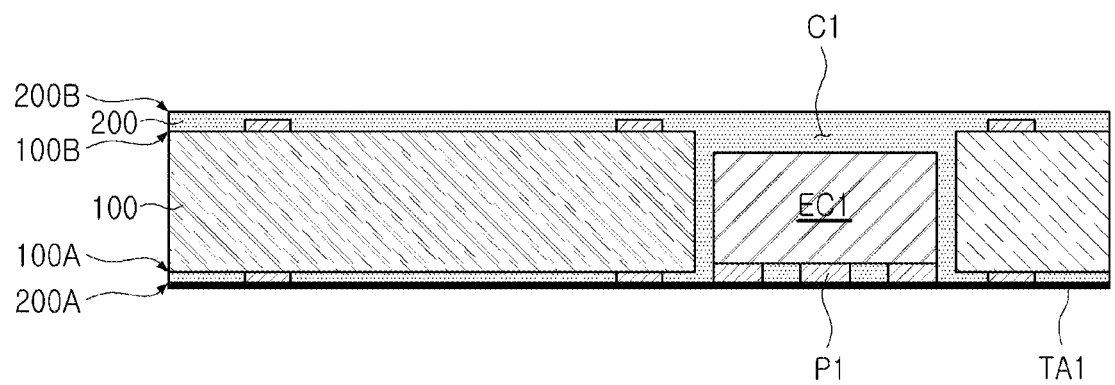

Thereafter, as illustrated in FIG. 6D, a second insulating layer 200 covering the first electronic component EC1 may be disposed on the first tape TA1. In this case, the second insulating layer 200 may extend to the first and second surfaces 100A and 100B facing each other of the first insulating layer 100. As a result, the first pad P1 of the first electronic component EC1 and a first surface 200A of the second insulating layer may be coplanar with each other. That is, the first pad P1 of the first electronic component EC1 may be disposed on the same plane as the first surface 200A of the second insulating layer, but is not limited thereto.

Figure 6E:
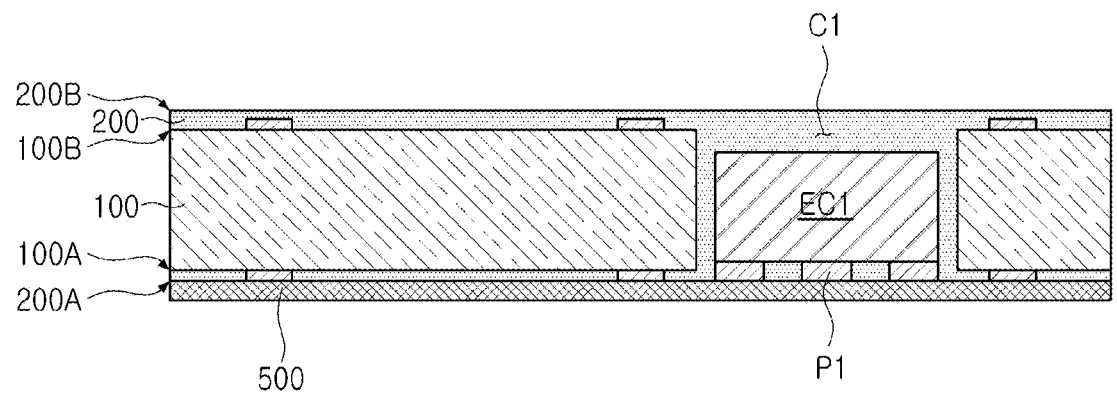

After disposing the first electronic component EC1 and the second insulating layer 200, the first tape TA1 may be removed. Thereafter, as illustrated in FIG. 6E, a fifth insulating layer 500 may be disposed on the first surface 200A of the second insulating layer 200 such that at least a portion thereof is in contact with the first electronic component EC1. In this case, the fifth insulating layer 500 may be in contact with the first pad P1 of the first electronic component while being disposed on the first surface 200A of the second insulating layer 200. In addition, a via penetrating at least a portion of the fifth insulating layer 500 may be formed so that the first pad P1 of the first electronic component is electrically connected to a circuit pattern disposed on the fifth insulating layer 500 through the via, but is not limited thereto.

Figure 6F:
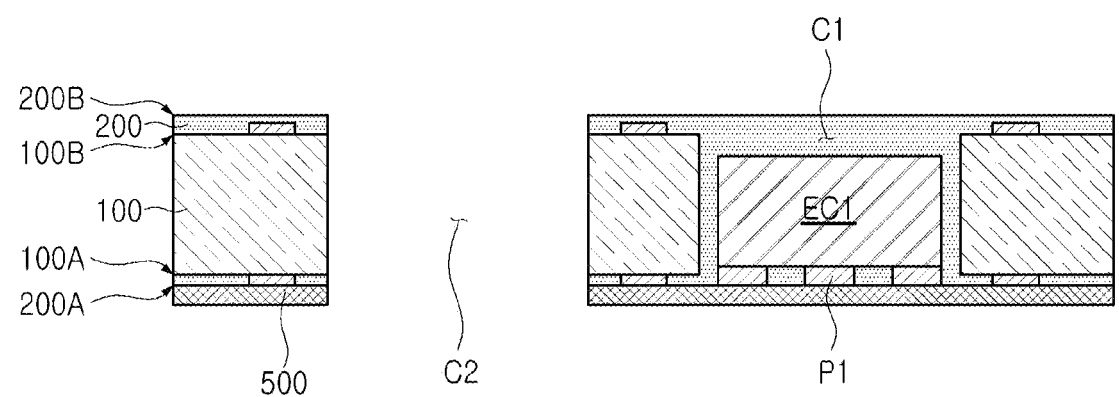

Thereafter, as shown in FIG. 6F, a second cavity C2 penetrating through at least a portion of each of the first, second, and fifth insulating layers 100, 200, and 500 may be formed. In this case, the second cavity C2 may be formed to entirely penetrate through the first, second, and fifth insulating layers 100, 200, and 500 in the thickness direction, but is not limited thereto. In addition, the second cavity C2 may be formed to have a cross-sectional area or a diameter corresponding to a size of a second electronic component EC2 to be described below, but is not limited thereto.

Figure 6G:
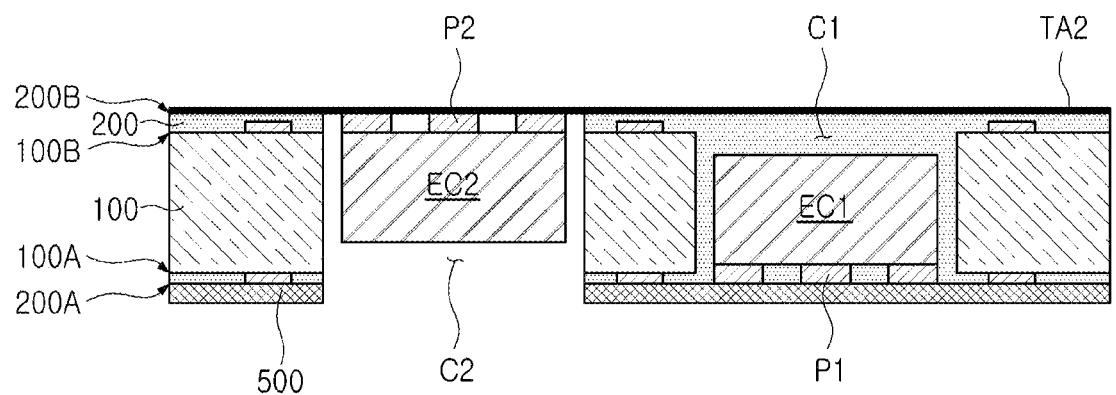

Thereafter, as illustrated in FIG. 6G, a second tape TA2 may be disposed to be entirely in contact with a second surface 200B of the second insulating layer 200. In this case, the second tape TA2 may extend to a bottom surface or one surface of the second cavity C2.

Thereafter, the second electronic component EC2 may be disposed inside the second cavity C2 penetrating through each of the first, second, and fifth insulating layers 100, 200, and 500 such that at least a portion thereof is in contact with the second tape TA2. In this case, the second electronic component EC2 may include a second pad P2, and the second pad P2 of the second electronic component EC2 may be disposed to be in contact with the second tape TA2.

As a result, the second pad P2 of the second electronic component EC2 and the second surface 200B of the second insulating layer may be coplanar with each other. That is, the second pad P2 of the second electronic component EC2 may be disposed on the same plane as the second surface 200B of the second insulating layer, but is not limited thereto.

Figure 6H:
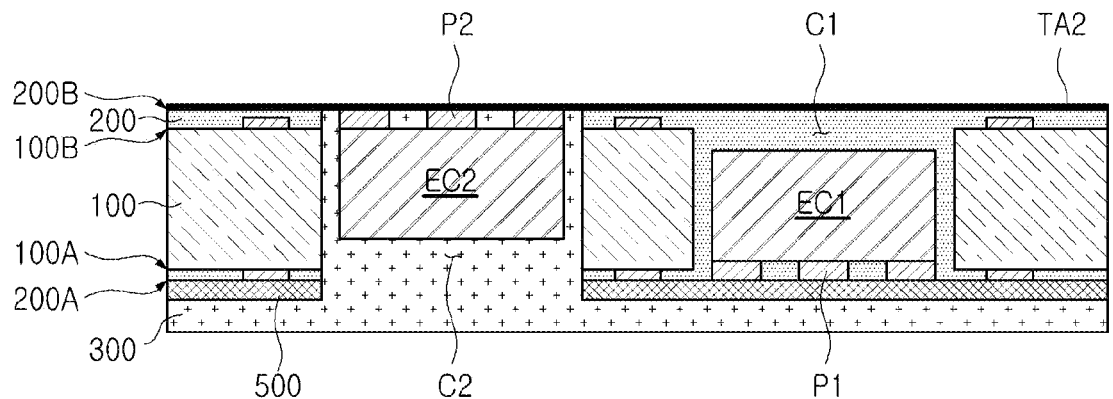

Thereafter, as illustrated in FIG. 6H, a third insulating layer 300 covering the second electronic component EC2 may be disposed on the second tape TA2. In this case, the third insulating layer 300 may extend to one surface of the fifth insulating layer 500, but is not limited thereto. That is, the fifth insulating layer 500 may be in contact with each of the first surface 200A of the second insulating layer 200 and the third insulating layer 300. In addition, a via penetrating through at least a portion of each of the third and fifth insulating layers 300 and 500 may be formed so that the first pad P1 of the first electronic component is electrically connected to a circuit pattern disposed on the third insulating layer 300 through the via, but is not limited thereto.

Figure 6I:
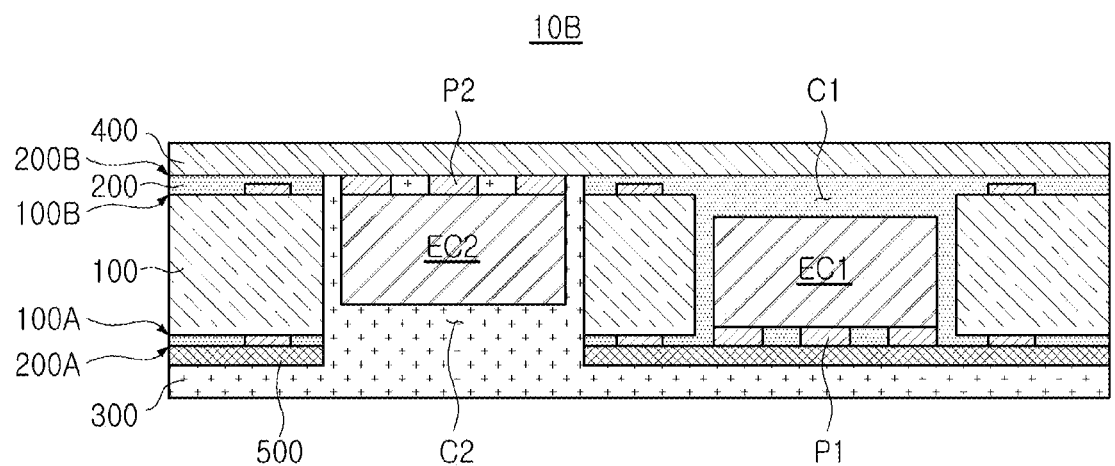

After disposing the second electronic component EC2 and the third insulating layer 300, the second tape TA2 may be removed. Thereafter, as illustrated in FIG. 6I, a fourth insulating layer 400 may be disposed on the second surface 200B facing the first surface of the second insulating layer 200, from which the second tape TA2 is removed, such that at least a portion thereof is in contact with the second pad P2 of the second electronic component.

Concerning the other components, what has been described above is substantially identically applicable, and thus, the description thereof will not be repeated.

Figure 7:
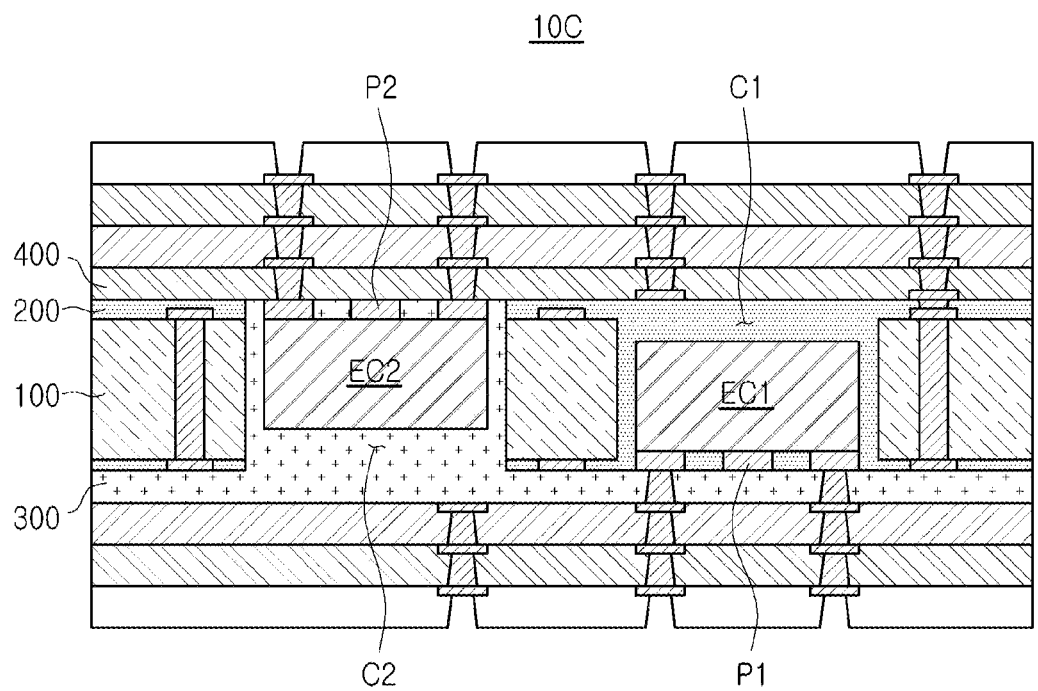
FIG. 7 is a diagram schematically illustrating an example of a printed circuit board according to the present disclosure.

FIG. 7 is a diagram schematically illustrating an example of a printed circuit board 10C according to the present disclosure.

The printed circuit board 10C according to the present disclosure may include a through hole penetrating through a first insulating layer 100 in a thickness direction. The through hole may be formed by a known method, and may include a known conductive material, but is not limited thereto. More specifically, a material applicable for the through hole may be a conductive material such as copper (Cu), aluminum (Al), silver (Ag), tin (Sn), gold (Au), nickel (Ni), lead (Pb), titanium (Ti), palladium (Pd), or alloys thereof, but is not limited thereto.

In addition, the printed circuit board 10C according to the present disclosure may include at least one build-up layer on opposite surfaces of the printed circuit boards 10A and 10B in which the respective pads of the first and second electronic components EC1 and EC2 are disposed toward the first and second surfaces facing each other of the first insulating layer.

In this case, each build-up insulating layer on opposite surfaces of the first insulating layer 100 may include a known insulating material, but is not limited thereto. More specifically, a material applicable for the at least one build-up insulating layer may be at least one of a thermosetting resin such as an epoxy resin, a thermoplastic resin such as a polyimide resin, and a resin in which the thermosetting or thermoplastic resin is impregnated together with an inorganic filler in a core material such as a glass fiber (glass cloth or glass fabric), for example, prepreg, Ajinomoto build-up film (ABF), FR-4, or bismaleimide triazine (BT).

In addition, each build-up insulating layer disposed on opposite surfaces of the printed circuit board 10C according to the present disclosure may include at least one circuit pattern and at least one via. Each of the circuit pattern and the via may be formed by a known method, and may include an electroless plating layer and an electrolytic plating layer. The electroless plating layer may serve as a seed layer for the electrolytic plating layer, but is not limited thereto.

In this case, the circuit pattern and the via may include a known conductive material, but is not limited thereto. More specifically, a material applicable for each of the circuit pattern and the via may be a conductive material such as copper (Cu), aluminum (Al), silver (Ag), tin (Sn), gold (Au), nickel (Ni), lead (Pb), titanium (Ti), palladium (Pd), or alloys thereof, but is not limited thereto.

The electroless plating layer and the electrolytic plating layer filling each of the circuit layer, the through hole, and the via of the printed circuit board 10C according to the present disclosure may also include copper (Cu), aluminum (Al), silver (Ag), tin (Sn), gold (Au), nickel (Ni), lead (Pb), titanium (Ti), palladium (Pd), or alloys thereof.

Concerning the other components, what has been described above is substantially identically applicable, and thus, the description thereof will not be repeated.

As set forth above, as one of the several effects of the present disclosure, it is possible to provide a printed circuit board including a microcircuit and/or a micro via.

As another one of the several effects of the present disclosure, it is possible to provide a printed circuit board in which an electronic component is mounted in a cavity.

As another one of the several effects of the present disclosure, it is possible to provide a printed circuit board for adjusting an insulation distance between electronic components mounted in both directions.

While exemplary embodiments have been shown and described above, it will be apparent to those skilled in the art that modifications and variations could be made without departing from the scope of the present invention as defined by the appended claims.

What is claimed is:

1. A printed circuit board comprising:
a first insulating layer including a first cavity and a second cavity;
a first electronic component disposed in the first cavity and including a first pad disposed in a first direction;
a second electronic component disposed in the second cavity and including a second pad disposed in a second direction opposite to the first direction;
a second insulating layer disposed in the first cavity and covering the first electronic component; and
a third insulating layer disposed in the second cavity and covering the second electronic component,
wherein an upper surface of the second pad is substantially coplanar with an upper surface of the second insulating layer.

2. The printed circuit board of claim 1, wherein the second and third insulating layers include the same composition.

3. The printed circuit board of claim 1, wherein the second insulating layer is disposed on each of first and second surfaces opposing each other of the first insulating layer, and the third insulating layer is disposed on the first surface of the first insulating layer.

4. The printed circuit board of claim 1, wherein the third insulating layer is in contact with a first surface of the second insulating layer.

5. The printed circuit board of claim 1, wherein at least a portion of the third insulating layer is in contact with the first pad of the first electronic component.

6. The printed circuit board of claim 1, further comprising a fourth insulating layer disposed on a second surface of the second insulating layer opposing a first surface of the second insulating layer.

7. The printed circuit board of claim 6, wherein at least a portion of the fourth insulating layer is in contact with the second pad of the second electronic component.

8. The printed circuit board of claim 6, further comprising:
a first wiring layer disposed on the third insulating layer;
a first via disposed in the third insulating layer and connecting the first wiring layer to the first pad of the first electronic component;
a second wiring layer disposed on the fourth insulating layer; and
a second via disposed in the fourth insulating layer and connecting the second wiring layer to the second pad of the second electronic component.

9. The printed circuit board of claim 1, further comprising a fifth insulating layer disposed on a first surface of the second insulating layer and being in contact with the third insulating layer.

10. The printed circuit board of claim 9, wherein the second, third, and fifth insulating layers include the same composition.

11. The printed circuit board of claim 1, wherein the second insulating layer includes first and second surfaces opposing each other, and
the first pad of the first electronic component and the first surface of the second insulating layer are coplanar with each other.

12. The printed circuit board of claim 1, wherein the second insulating layer includes first and second surfaces opposing each other, and
the second pad of the second electronic component and the second surface of the second insulating layer are coplanar with each other.

13. The printed circuit board of claim 1, wherein the second insulating layer includes first and second surfaces opposing each other,
the first pad of the first electronic component and the first surface of the second insulating layer are coplanar with each other, and
the second pad of the second electronic component and the second surface of the second insulating layer are coplanar with each other.

14. A printed circuit board comprising:
a first insulating layer having first and second surfaces opposing each other, and including a first cavity penetrating through the first and second surfaces;
a first electronic component disposed in the first cavity and including a first pad;
a second insulating layer disposed in the first cavity to cover the first electronic component, and extending on the first and second surfaces of the first insulating layer;

a second electronic component including a second pad and disposed in a second cavity which penetrates through the first insulating layer and the second insulating layer;

a third insulating layer disposed in the second cavity to cover the second electronic component, and extending on the second insulating layer; and a fifth insulating layer disposed between the second insulating layer and the third insulating layer, wherein the first pad and the second pad are disposed in opposite directions.

15. The printed circuit board of claim 14, further comprising a fourth insulating layer disposed on the second insulating layer and being in contact with the second pad.

16. The printed circuit board of claim 15, wherein the third insulating layer is in contact with the second insulating layer and the first pad.

17. The printed circuit board of claim 14, wherein the second cavity also penetrates through the fifth insulating layer, and the fifth insulating layer is in contact with the second insulating layer and the first pad.

\* \* \* \* \*